US012597875B2

(12) United States Patent　　　　(10) Patent No.:　US 12,597,875 B2
Okada et al.　　　　　　　　　　　(45) Date of Patent:　　Apr. 7, 2026

(54) MOTOR CONTROL DEVICE, VEHICLE, COMPUTER PROGRAM, AND RECORDING MEDIUM STORING COMPUTER PROGRAM

(71) Applicant: SUBARU CORPORATION, Tokyo (JP)

(72) Inventors: Tomoyuki Okada, Tokyo (JP); Satoshi Yoshizawa, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 213 days.

(21) Appl. No.: 18/283,594

(22) PCT Filed: Mar. 30, 2022

(86) PCT No.: PCT/JP2022/016039
§ 371 (c)(1),
(2) Date: Sep. 22, 2023

(87) PCT Pub. No.: WO2023/188123
PCT Pub. Date: Oct. 5, 2023

(65) Prior Publication Data
US 2025/0038690 A1　　Jan. 30, 2025

(51) Int. Cl.
*H02P 27/04*　　　(2016.01)
*B60L 50/13*　　　(2019.01)
(Continued)

(52) U.S. Cl.
CPC .............. *H02P 27/06* (2013.01); *B60L 50/13* (2019.02); *H05K 7/2089* (2013.01); *B60L 2210/40* (2013.01); *H02M 7/537* (2013.01)

(58) Field of Classification Search
CPC .......... H02P 27/06; H02P 27/04; H02P 29/60; H02P 29/68
See application file for complete search history.

(56) References Cited

U.S. PATENT DOCUMENTS

2019/0296678 A1 * 9/2019 Omata ................... H02P 29/50
2023/0191919 A1 * 6/2023 Ganesan ................ B60L 15/38
　　　　　　　　　　　　　　　　　　　　　701/22

FOREIGN PATENT DOCUMENTS

JP　　2009-029397 A　　2/2009
JP　　2016-131444 A　　7/2016
(Continued)

OTHER PUBLICATIONS

Japanese Office Action, dated Jul. 9, 2024 in Japanese Application No. 2023-563997 and English Translation thereof.
(Continued)

*Primary Examiner* — Karen Masih
(74) *Attorney, Agent, or Firm* — McGinn IP Law Group, PLLC

(57)　　　　　　　ABSTRACT

A motor control device that controls driving of a first inverter and a second inverter each configured to control a supply current to a three-phase alternating-current motor. The motor control device is configured to: switch a control mode between a single-inverter control mode in which one of the first inverter and the second inverter is driven to control the supply current to the motor, and a twin-inverter control mode in which both the first inverter and the second inverter are driven to control the supply current to the motor; calculate each of a first power loss due to the single-inverter control mode and a second power loss due to the twin-inverter control mode; and set the control mode to the first power loss or the second power loss, whichever has a smaller power loss.

5 Claims, 8 Drawing Sheets

(51) Int. Cl.
H02P 27/06 (2006.01)
H05K 7/20 (2006.01)
*H02M 7/537* (2006.01)

(56) References Cited

FOREIGN PATENT DOCUMENTS

| | | |
|---|---|---|
| JP | 2020-018148 A | 1/2020 |
| JP | 2021-049862 A | 4/2021 |
| WO | WO 2013/108356 A1 | 7/2013 |

OTHER PUBLICATIONS

International Search Report (ISR) (PCT Form PCT/ISA/210), in PCT/JP2022/016039, dated Jun. 14, 2022, with translation of relevant portion.
Written Opinion of the ISA (PCT Form PCT/ISA/237) in PCT/JP2022/016039, dated Jun. 14, 2022.

\* cited by examiner

FIG. 9

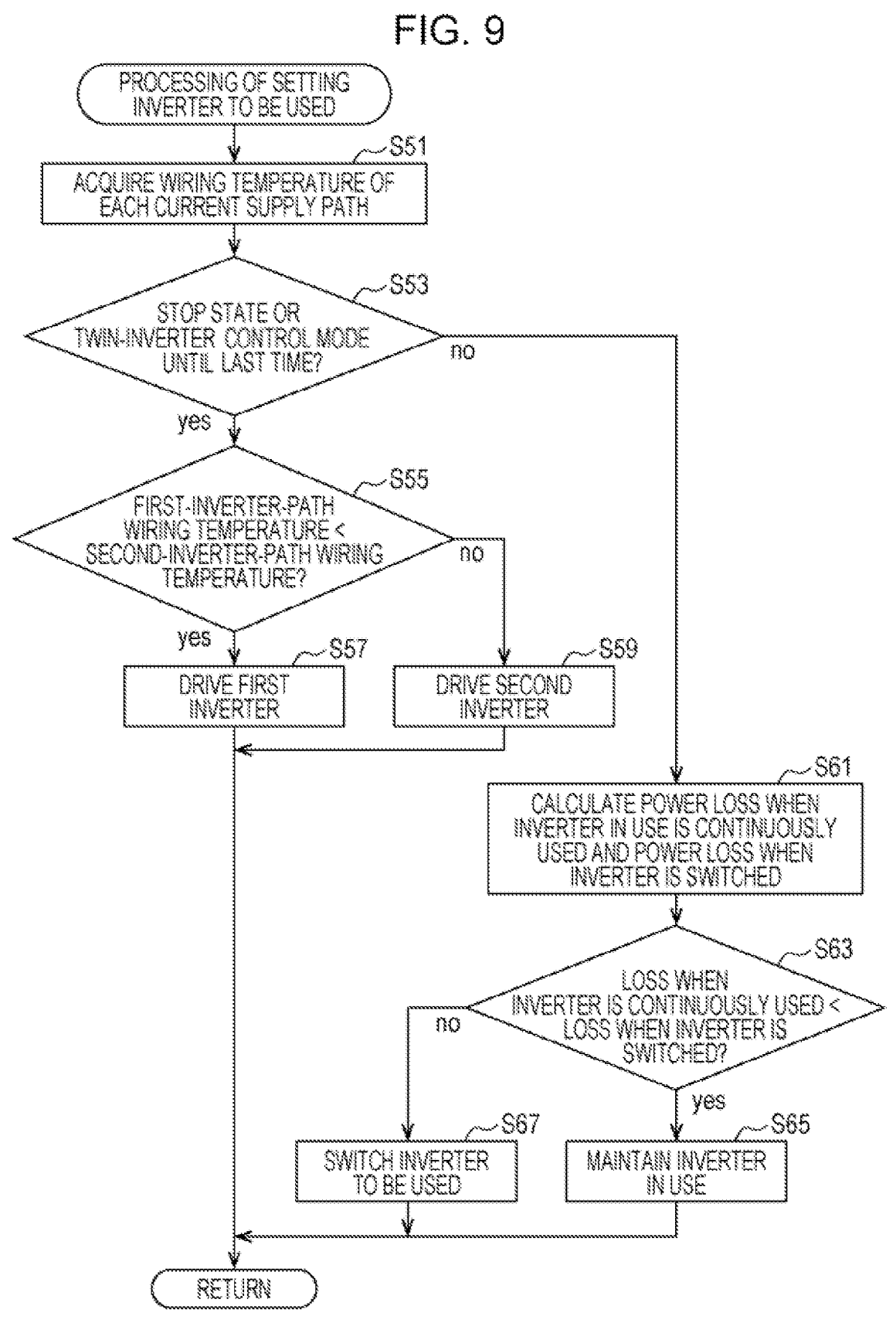

PROCESSING OF SETTING
INVERTER TO BE USED

S51
ACQUIRE WIRING TEMPERATURE OF
EACH CURRENT SUPPLY PATH

S53
STOP STATE OR
TWIN-INVERTER CONTROL MODE
UNTIL LAST TIME?

no yes

S55
FIRST-INVERTER-PATH
WIRING TEMPERATURE <
SECOND-INVERTER-PATH WIRING
TEMPERATURE?

no yes

S57
DRIVE FIRST
INVERTER

S59
DRIVE SECOND
INVERTER

S61
CALCULATE POWER LOSS WHEN
INVERTER IN USE IS CONTINUOUSLY
USED AND POWER LOSS WHEN
INVERTER IS SWITCHED

S63
LOSS WHEN
INVERTER IS CONTINUOUSLY USED <
LOSS WHEN INVERTER IS
SWITCHED?

no yes

S67
SWITCH INVERTER
TO BE USED

S65
MAINTAIN INVERTER
IN USE

RETURN

A: POWER CONSUMPTION OF FIRST INVERTER
B: POWER CONSUMPTION OF SECOND INVERTER
C: POWER CONSUMPTION WHEN INVERTER IS SWITCHED

D: POWER CONSUMPTION WHEN FIRST INVERTER IS
    CONTINUOUSLY USED
E: POWER CONSUMPTION WHEN INVERTER IS SWITCHED

1

MOTOR CONTROL DEVICE, VEHICLE, COMPUTER PROGRAM, AND RECORDING MEDIUM STORING COMPUTER PROGRAM

CROSS-REFERENCE TO RELATED APPLICATIONS

This application is the U.S. National Phase under 35 U.S.C. § 371 of International Application No. PCT/JP2022/016039, filed on Mar. 30, 2022.

TECHNICAL FIELD

The present disclosure relates to a motor control device, a vehicle, a computer program, and a recording medium storing the computer program.

BACKGROUND ART

Hybrid electric vehicles and battery electric vehicles (hereinafter, collectively referred to as electric vehicles) include a drive motor that outputs a driving force of the vehicle. In recent years, it has been studied to drive a drive motor by multiple inverters in order to increase the torque or current of the drive motor or to ensure the redundancy of a drivetrain.

For example, PTL 1 discloses a control device for a vehicle in which two inverters are coupled to one motor, and the operation of the first inverter and the operation of the second inverter are selectively controlled based on the current to be used for the motor so that the first and second inverters operate with high efficiency. Also, PTL 2 discloses a motor drive system including two inverters that control two stators of a double-stator axial gap motor.

CITATION LIST

Patent Literature

PTL 1: Japanese Unexamined Patent Application Publication No. 2009-029397

PTL 2: Japanese Unexamined Patent Application Publication No. 2016-131444

SUMMARY OF INVENTION

Technical Problem

In the motor drive systems described in PTL 1 and PTL 2, power supply to the drive motor can be distributed by driving the drive motor using the two inverters. Thus, a large current can be supplied to the drive motor while an increase in wiring resistance due to a rise in inverter temperature is suppressed. Also, when three-phase windings each including a u phase, a v phase, and a w phase are coupled to the inverters, the currents supplied to the three-phase windings are distributed, so that copper losses of the three-phase windings can be reduced.

However, when the drive motor is driven by the two inverters, it is not easy to completely synchronize the control of the two inverters due to, for example, steady-state errors of sensors used for controlling the inverters, variations in manufacturing of components, and a deviation in control timing. Thus, there is room for improvement in view of that the power efficiency of the drive motor when the drive motor is driven by the two inverters may be decreased as compared with the power efficiency when the drive motor is driven by one inverter.

In contrast, when the drive motor is driven by one inverter, the current flowing through electric wiring of a power supply system increases as compared with the current when the drive motor is driven by the two inverters. Thus, the loss of wiring resistance increases, and the temperature of the electric wiring rises. Since the wiring resistance depends on the temperature of the electric wiring, an increase in wiring resistance and an increase in loss may be looped.

The present disclosure is made in light of the above-described problem, and an object of the present disclosure is to provide a motor control device, a vehicle, a computer program, and a recording medium storing the computer program that are capable of driving a drive motor to which multiple inverters are coupled with high power efficiency.

Solution to Problem

An aspect of the present disclosure provides a motor control device configured to control driving of a first inverter and a second inverter each configured to control a supply current to a three-phase alternating-current motor. The motor control device includes one or more processors and one or more memories communicably coupled to the one or more processors. The one or more processors are configured to switch a control mode between a single-inverter control mode in which one of the first inverter and the second inverter is driven to control the supply current to the motor, and a twin-inverter control mode in which both the first inverter and the second inverter are driven to control the supply current to the motor; calculate each of a first power loss due to the single-inverter control mode and a second power loss due to the twin-inverter control mode based on a power loss of the motor, a power loss of the first inverter, a power loss of the second inverter, a power loss of a current supply path from the first inverter to the motor, and a power loss of a current supply path from the second inverter to the motor; set the control mode to the first power loss or the second power loss, whichever has a smaller power loss; and, during the single-inverter control mode, acquire a temperature of the current supply path from the first inverter to the motor and a temperature of the current supply path from the second inverter to the motor, and switch an inverter to be used between the first inverter and the second inverter so that each of the temperature of the current supply path from the first inverter to the motor and the temperature of the current supply path from the second inverter to the motor is maintained to be lower than a heat-resistance threshold.

An aspect of the present disclosure provides a vehicle comprising a motor drive system. The motor drive system includes a three-phase alternating-current motor, and a first inverter and a second inverter each configured to control a supply current to the motor. A motor control device configured to control the motor drive system is configured to switch a control mode between a single-inverter control mode in which one of the first inverter and the second inverter is driven to control the supply current to the motor, and a twin-inverter control mode in which both the first inverter and the second inverter are driven to control the supply current to the motor; calculate each of a first power loss due to the single-inverter control mode and a second power loss due to the twin-inverter control mode based on a power loss of the motor, a power loss of the first inverter, a power loss of the second inverter, a power loss of a current supply path from the first inverter to the motor, and a power loss of a current supply path from the second inverter to the motor; set the control mode to the first power loss or the second power loss, whichever has a smaller power loss; and, during the single-inverter control mode, acquire a temperature of the current supply path from the first inverter to the motor and a temperature of the current supply path from the second inverter to the motor, and switch an inverter to be used between the first inverter and the second inverter so that each of the temperature of the current supply path from the first inverter to the motor and the temperature of the current supply path from the second inverter to the motor is maintained to be lower than a heat-resistance threshold.

An aspect of the present disclosure provides a recording medium storing a computer program that is to be applied to a motor drive system configured to control driving of a first inverter and a second inverter each configured to control a supply current to a three-phase alternating-current motor. The motor drive system is configured to switch a control mode between a single-inverter control mode in which one of the first inverter and the second inverter is driven to control the supply current to the motor and a twin-inverter control mode in which both the first inverter and the second inverter are driven to control the supply current to the motor. The computer program causes one or more processors to execute: calculating each of a first power loss due to the single-inverter control mode and a second power loss due to the twin-inverter control mode based on a power loss of the motor, a power loss of the first inverter, a power loss of the second inverter, a power loss of a current supply path from the first inverter to the motor, and a power loss of a current supply path from the second inverter to the motor; setting the control mode to the first power loss or the second power loss, whichever has a smaller power loss; and, during the single-inverter control mode, acquiring a temperature of the current supply path from the first inverter to the motor and a temperature of the current supply path from the second inverter to the motor, and switching an inverter to be used between the first inverter and the second inverter so that each of the temperatures is maintained to be lower than a heat-resistance threshold.

Advantageous Effects of Invention

Advantageous Effects of Invention

As described above, according to the present disclosure, it is possible to drive a drive motor to which multiple inverters are coupled with high power efficiency.

BRIEF DESCRIPTION OF DRAWINGS

FIG. 9 is a flowchart illustrating processing of setting an inverter to be used according to the same embodiment.

DESCRIPTION OF EMBODIMENTS

Figures 1, 2:
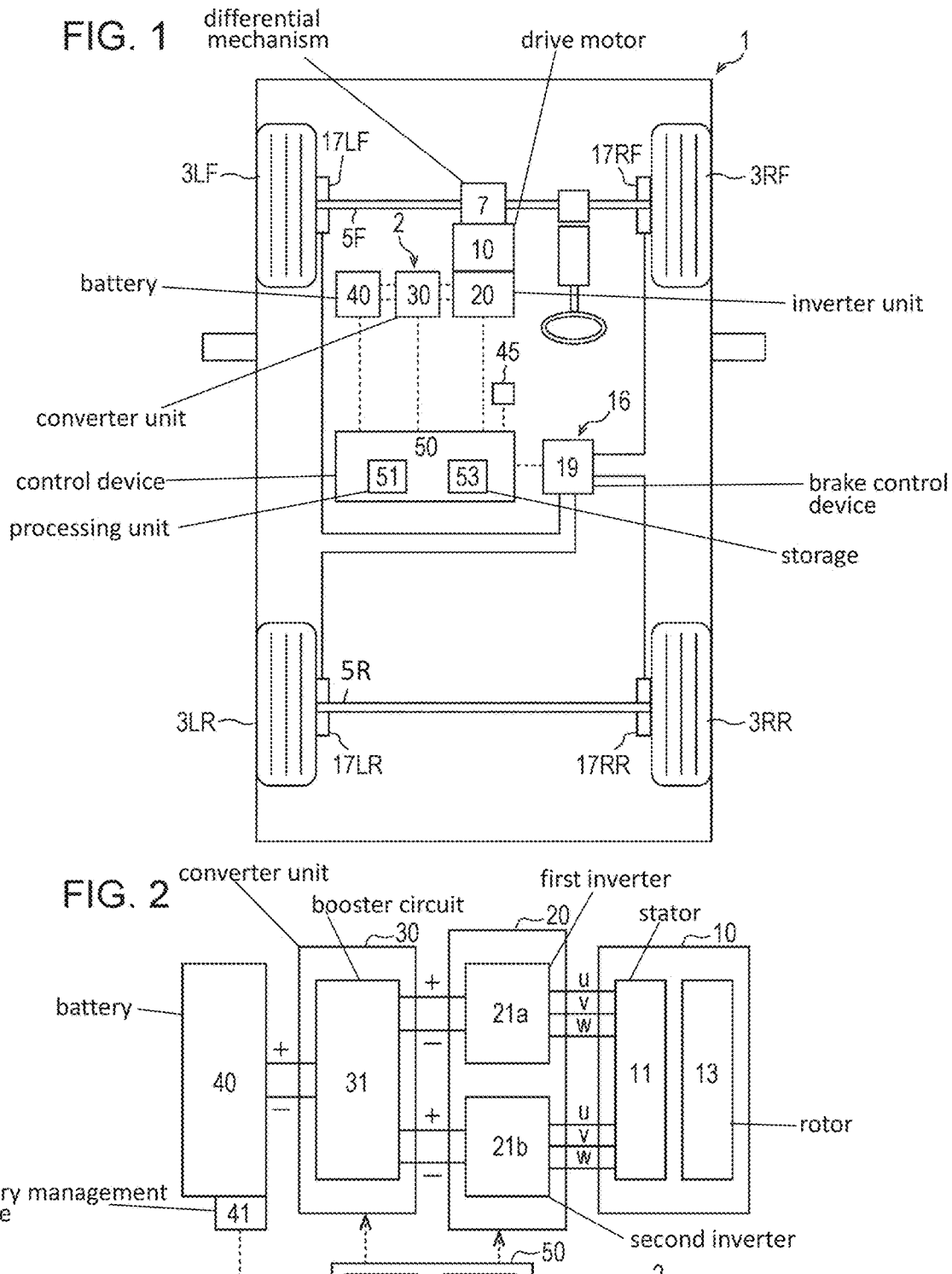
FIG. 1 is a schematic diagram illustrating a configuration example of a vehicle to which a motor control device according to an embodiment can be applied.
FIG. 2 is a block diagram schematically illustrating a configuration example of a motor drive system.

Hereinafter, embodiments of the present disclosure will be described in detail with reference to the accompanying drawings. In the description and the drawings, components having substantially the same functions and configurations are denoted by the same reference numerals, and redundant description thereof will be omitted.

1. BASIC CONFIGURATION

First, a basic configuration common to the embodiments of the present disclosure will be described.
<1-1. Configuration Example of Vehicle>

FIG. 1 is a schematic diagram illustrating a configuration example of a vehicle 1 to which a motor control device according to an embodiment can be applied. The vehicle 1 illustrated in FIG. 1 is a four-wheel electric vehicle including a front left wheel 3LF, a front right wheel 3RF, a rear left wheel 3LR, and a rear right wheel 3RR (hereinafter collectively referred to as "wheels 3" unless otherwise specified), and is configured as a two-wheel drive electric vehicle that transmits a driving torque output from a drive motor 10 as a driving force source that generates a driving torque of the vehicle 1 to the front left wheel 3LF and the front right wheel 3RF (hereinafter collectively referred to as "front wheels 3F" unless otherwise specified).

Alternatively, the vehicle 1 may be configured as a four-wheel drive electric vehicle. In this case, the vehicle 1 may be equipped with a front-wheel drive motor and a rear-wheel drive motor, or may be provided with in-wheel motors mounted on the wheels.

The vehicle 1 includes a motor drive system 2 and a hydraulic brake system 16. The hydraulic brake system 16 includes brake devices 17LF, 17RF, 17LR, and 17RR (hereinafter collectively referred to as brake devices 17) provided in the wheels 3, and a brake hydraulic control device 19 that controls a hydraulic pressure supplied to each of the brake devices 17. Each of the brake devices 17 is configured as, for example, a device that applies a braking force to the wheel 3 by sandwiching a brake disk rotating together with the wheel with brake pads using a supplied hydraulic pressure. The brake hydraulic control device 19 includes an electric motor pump that discharges a brake fluid, multiple solenoid valves that adjust the hydraulic pressures supplied to the brake devices 17, and a brake control device that controls driving of the electric motor pump and the solenoid valves. The hydraulic brake system 16 generates a predetermined braking force on each of the front, rear, left, and right wheels 3LF, 3RF, 3LR, and 3RR by controlling the hydraulic pressure supplied to the corresponding brake device 17. The hydraulic brake system 16 is used in combination with regenerative braking using the drive motor 10.

The motor drive system 2 includes the drive motor 10, an inverter unit 20, a converter unit 30, a battery 40, and a control device 50. The control device 50 has a function as a motor control device that controls the drive motor 10. An exemplary configuration of the motor drive system 2 will be described in detail later.

Also, the vehicle 1 includes a vehicle-state sensor 45. The vehicle-state sensor 45 is coupled to the control device 50 via a dedicated line or via a communication method such as a CAN (Controller Area Network) or a LIN (Local Interconnect Network).

The vehicle-state sensor 45 includes one or more sensors that detect an operation state and a behavior of the vehicle 1 (hereinafter also collectively referred to as "vehicle state"). The vehicle-state sensor 45 includes, for example, one or more of a steering angle sensor, an accelerator position sensor, a brake stroke sensor, a brake pressure sensor, and an engine rotational speed sensor. The vehicle-state sensor 45 detects an operation state of the vehicle 1 such as a steering angle of a steering wheel or a steered wheel, an accelerator opening degree, a brake operation amount, or an engine rotational speed. Also, the vehicle-state sensor 45 includes, for example, one or more of a vehicle speed sensor, an acceleration sensor, and an angular velocity sensor. The vehicle-state sensor 45 detects a behavior of the vehicle 1 such as a vehicle speed, a longitudinal acceleration, a lateral acceleration, or a yaw rate. The vehicle-state sensor 45 transmits a sensor signal including detected information to the control device 50.

In the present embodiment, the vehicle-state sensor 45 includes at least the accelerator position sensor, the brake stroke sensor, and the vehicle speed sensor. The accelerator position sensor detects an operation amount of an accelerator pedal by a driver who drives the vehicle. For example, the accelerator position sensor may be a sensor that detects a rotation amount of a rotating shaft of an accelerator pedal, but is not limited thereto. The brake stroke sensor detects an operation amount of a brake pedal by the driver. The brake stroke sensor may be a sensor that detects a movement amount of an output rod coupled to the brake pedal, may be a sensor that detects a rotation amount of a rotating shaft of the brake pedal, or may be a sensor that detects a depression force of the brake pedal, but is not limited thereto. The vehicle speed sensor may be, for example, a sensor that detects a rotational speed of any one of a rotating shaft of the drive motor 10, a front-wheel drive axle 5F, and a rear-wheel drive axle 5R, but is not limited thereto.

<1-2. Motor Drive System>

Next, an exemplary configuration of the motor drive system 2 will be described.

Figure 3:
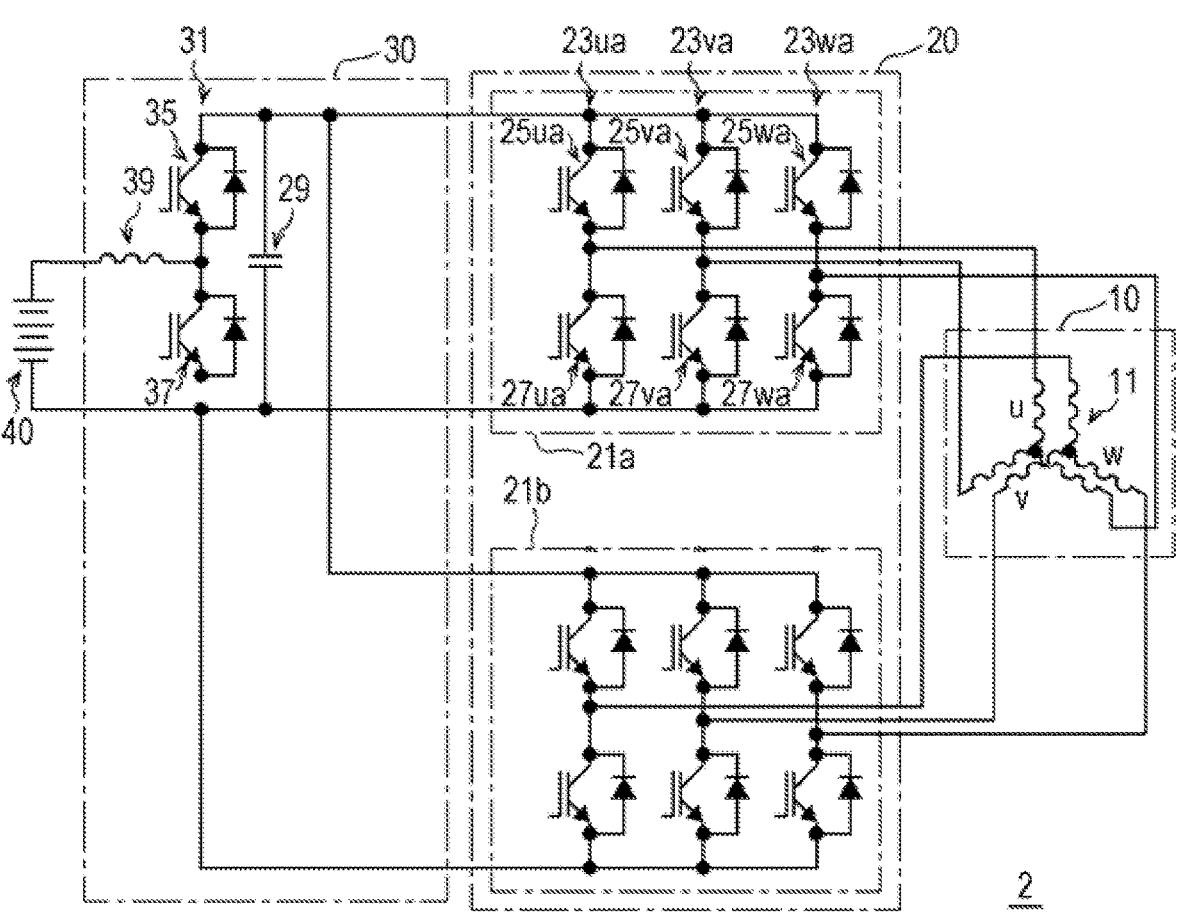
FIG. 3 is a circuit diagram illustrating the configuration example of the motor drive system.

FIGS. 2 and 3 are explanatory diagrams illustrating a configuration example of the motor drive system 2. FIG. 2 is a block diagram schematically illustrating a configuration example of the motor drive system 2. FIG. 3 is a circuit diagram illustrating the configuration example of the motor drive system 2.

As illustrated in FIG. 2, the motor drive system 2 includes the drive motor 10, the inverter unit 20, the converter unit 30, the battery 40, and the control device 50. The battery 40 is a chargeable and dischargeable secondary battery. For example, the battery 40 may be a lithium ion battery with a rated voltage of 200 V, but the rated voltage and type of the battery 40 are not limited thereto. The battery 40 is coupled to the drive motor 10 via the converter unit 30 and the inverter unit 20, and stores electric power to be supplied to the drive motor 10. The battery 40 is provided with a battery management device 41 that detects, for example, an opencircuit voltage, an output voltage, and a battery temperature of the battery 40 and transmits the detected values to the control device 50.

The drive motor 10 outputs a driving torque to be transmitted to the front wheels 3F via a differential mechanism 7 and the front-wheel drive axle 5F. Driving of the drive motor 10 is controlled by the control device 50. The drive motor 10 includes a rotor 13 and a stator 11 provided around the outer periphery of the rotor 13 with a gap. The drive motor 10 is configured as a three-phase alternating-current motor. However, the number of phases is not limited thereto. In the drive motor 10, the rotor 13 rotates by a rotating magnetic field formed by a three-phase alternating current supplied to the stator 11, and a driving torque is output. Also, the drive motor 10 has a function of performing regenerative power generation by the rotor 13 rotating by receiving a rotational torque of the front wheels 3F transmitted via the front-wheel drive axle 5F in a state in which the three-phase alternating current is not supplied to the stator 11.

The inverter unit 20 includes a first inverter 21a and a second inverter 21b. In the present embodiment, the drive motor 10 is configured as a double three-phase motor in which two three-phase windings are provided for one stator 11 and which is controlled by two inverters of the first inverter 21a and the second inverter 21b. Each of the first inverter 21a and the second inverter 21b converts direct-current power swept from the battery 40 into three-phase alternating-current power and supplies the three-phase alternating-current power to the stator 11 of the drive motor 10. Also, the first inverter 21a and the second inverter 21b convert three-phase alternating-current power regenerated by the stator 11 into direct-current power and supply the direct-current power to the converter unit 30. Driving of the inverter unit 20 is controlled by the control device 50.

The converter unit 30 includes a booster circuit 31. The booster circuit 31 boosts a voltage of electric power regenerated by the drive motor 10 to a requested charge voltage of the battery 40, and supplies the boosted voltage to the battery 40. The booster circuit 31 may have a function of stepping up or stepping down the output voltage of the battery 40 and supplying the stepped-up or stepped-down voltage to the inverter unit 20. Driving of the converter unit 30 is controlled by the control device 50. Alternatively, the booster circuit 31 may be omitted from the motor drive system 2.

As illustrated in FIG. 3, each of the first inverter 21a and the second inverter 21b includes multiple switching elements. The operations of the switching elements of the first inverter 21a and the second inverter 21b are controlled by the control device 50. The first inverter 21a and the second inverter 21b have the same configuration. Hereinafter, the configuration of the first inverter 21a will be described, and the description of the configuration of the second inverter 21b will be omitted.

The first inverter 21a includes three arm circuits 23ua, 23va, and 23wa (hereinafter collectively referred to simply as arm circuits 23a unless otherwise specified). The arm circuit 23ua is electrically coupled to a u-phase coil of the stator 11 of the drive motor 10. The arm circuit 23va is electrically coupled to a v-phase coil of the stator 11 of the drive motor 10. The arm circuit 23wa is electrically coupled to a w-phase coil of the stator 11 of the drive motor 10. Each arm circuit 23a includes an upper arm electrically coupled to the positive electrode side of the battery 40, and a lower arm electrically coupled to the negative electrode side of the battery 40.

The upper arms of the arm circuits 23a are provided with switching elements 25ua, 25va, and 25wa to which diodes are electrically coupled in inverse-parallel. The lower arms of the arm circuits 23a are provided with switching elements 27ua, 27va, and 27wa to which diodes are electrically coupled in inverse-parallel. The switching elements 25ua, 27ua, 25va, 27va, 25wa, and 27wa may be, for example, MOSFETs (Metal Oxide Semiconductor Field Effect Transistors) or IGBTs (Insulated Gate Bipolar Transistors), but may be other switching elements.

The u-phase, v-phase, and w-phase coils of the stator 11 of the drive motor 10 are electrically coupled to coupling portions between the upper arms and the lower arms of the arm circuits 23ua, 23va, and 23wa. The operations of the switching elements 25ua, 27ua, 25va, 27va, 25wa, and 27wa of the arm circuits 23ua, 23va, and 23wa are controlled by the control device 50.

The second inverter 21b is configured similarly to the first inverter 21a.

A booster circuit 31 includes a coil 39, two switching elements 35 and 37, and a smoothing capacitor 29. The booster circuit 31 includes an upper arm electrically coupled to the upper arm sides of the first inverter 21a and the second inverter 21b, and a lower arm electrically coupled to the lower arm sides of the first inverter 21a and the second inverter 21b. The upper arm and the lower arm are respectively provided with the switching elements 35 and 37 to which diodes are electrically coupled in inverse-parallel. The switching elements 35 and 37 may be, for example, MOSFETs or IGBTs, but may be other switching elements.

When the electric power of the battery 40 is supplied to the first inverter 21a and the second inverter 21b, switching control is performed on each of the two switching elements 35 and 37 of the booster circuit 31, so that the electric power of the battery 40 is stepped up and supplied to the first inverter 21a and the second inverter 21b. Also, when the battery 40 is charged with the power regenerated by the drive motor 10, switching control is performed on each of the two switching elements 35 and 37 of the booster circuit 31, so that the regenerated power output from the first inverter 21a and the regenerated power output from the second inverter 21b are stepped up and supplied to the battery 40. The step-up ratio is adjusted in accordance with the on/off duty ratio of the switching elements 35 and 37. The operations of the switching elements 35 and 37 are controlled by the control device 50.

One end of the coil 39 is electrically coupled to the positive electrode side of the battery 40, and the other end of the coil 39 is electrically coupled between the two switching elements 35 and 37. The smoothing capacitor 29 is coupled in parallel with the battery 40 with respect to each of the first inverter 21a and the second inverter 21b.

The control device 50 controls driving of the first inverter 21a, the second inverter 21b, and the booster circuit 31 to drive the drive motor 10. For example, the control device 50 calculates a requested torque of the drive motor 10 based on a requested acceleration of the vehicle 1. When the requested acceleration is a positive value, the control device 50 controls the driving of the switching elements provided in the first inverter 21a, the second inverter 21b, and the booster circuit 31 based on the calculated requested torque to drive the drive motor 10. Thus, the drive motor 10 outputs a driving torque of the vehicle 1.

In contrast, when the requested acceleration is a negative value, the control device 50 controls the driving of the switching elements provided in the first inverter 21a, the second inverter 21b, and the booster circuit 31 based on the calculated requested torque, thereby causing the drive motor 10 to perform the regenerative power generation. Thus, the drive motor 10 performs regenerative power generation to generate a regenerative brake torque.

In the present embodiment, the control device 50 is configured to be able to switch a control mode between a single-inverter control mode in which one of the first inverter 21a and the second inverter 21b is driven to control a supply current to the drive motor 10 and a twin-inverter control mode in which both the first inverter 21a and the second inverter 21b are driven to control the supply current to the drive motor 10. The control device 50 selects the single-inverter control mode or the twin-inverter control mode so as to increase power efficiency.

<1-3. Functional Configuration of Control Device>

Hereinafter, a functional configuration of the control device 50 will be briefly described. An exemplary embodiment of control processing by a processing unit 51 will be described in detail later.

The control device 50 functions as a device that controls the drive motor 10 by a processor such as one or more CPUs executing a computer program. The computer program is a computer program for causing the processor to execute an operation (described later) to be executed by the control device 50. The computer program to be executed by the processor may be recorded in a recording medium functioning as a storage (memory) included in the control device 50, or may be recorded in a recording medium built in the control device 50 or any recording medium externally attachable to the control device 50.

The recording medium in which the computer program is recorded may be any of media including a magnetic medium such as a hard disk, a floppy disk, or a magnetic tape; an optical recording medium such as a CD-ROM (Compact Disk Read Only Memory), a DVD (Digital Versatile Disk), or a Blu-ray (registered trademark); a magneto-optical medium such as a floptical disk; a storage element such as a RAM (Random Access Memory) or a ROM (Read Only Memory); a flash memory such as a USB (Universal Serial Bus) memory or a SSD (Solid State Drive); and any other medium capable of storing a program.

Figure 4:
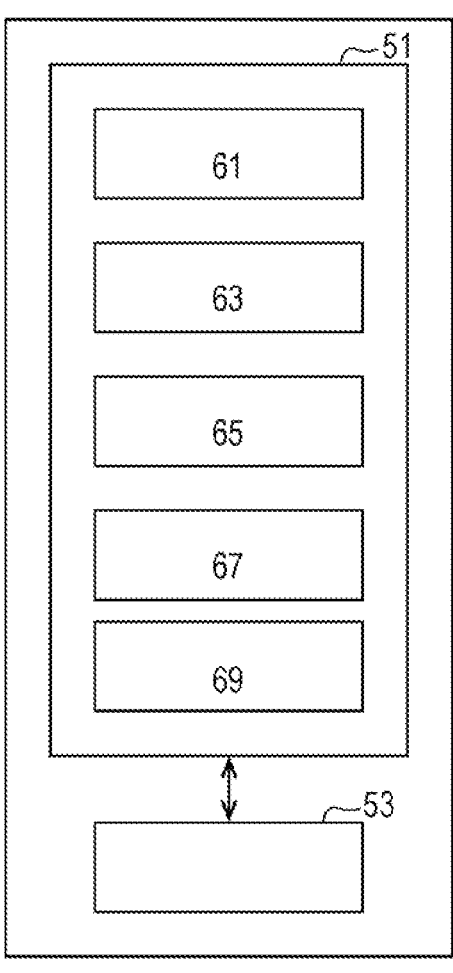
FIG. 4 is a block diagram illustrating a functional configuration of a motor control device according to the embodiment.

FIG. 4 is a block diagram illustrating the functional configuration of the control device 50.

The control device 50 includes a processing unit 51 and a storage 53. The processing unit 51 includes a processor such as one or more CPUs (Central Processing Units). Alternatively, the processing unit 51 may be partly or entirely constituted by an updatable object such as firmware, or may be a program module or the like to be executed by a command from the processor. However, the processing unit 51 may be partly or entirely constituted using hardware.

The storage 53 is constituted by one or more storage elements (memories) such as a RAM (Random Access Memory) or a ROM (Read Only Memory) communicably coupled to the processing unit 51. However, the number and types of storages 53 are not limited thereto. The storage 53 stores a computer program to be executed by the processing unit 51 and data such as various parameters used for calculation processing, detection data, and a calculation result. In addition, the control device 50 includes an interface for communicating with, for example, the battery management device 41, and the vehicle-state sensor 45.

The processing unit 51 includes an acquirer 61, a requested torque calculator 63, a power loss calculator 65, a control-mode setting unit 67, and an inverter controller 69. Each of these units may be a function implemented by execution of a computer program by the processor, but may be partly or entirely constituted by hardware such as an analog circuit.

(Acquirer)

The acquirer 61 acquires sensor signals output from various sensors provided in the motor drive system 2 and the vehicle 1. The sensors include temperature sensors provided in the drive motor 10, the first inverter 21*a*, the second inverter 21*b*, a current supply path from the first inverter 21*a* to the drive motor 10, and a current supply path from the second inverter 21*b* to the drive motor 10. Also, the sensors include a rotation sensor that detects the rotational speed of the drive motor 10.

(Requested Torque Calculator)

The requested torque calculator 63 calculates a requested torque of the drive motor 10. For example, the requested torque calculator 63 calculates a requested torque (requested driving torque) based on a requested acceleration of the vehicle 1. The requested acceleration is obtained based on, for example, an operation amount of the accelerator pedal and an operation amount of the brake pedal. When the vehicle 1 is under autonomous driving control, the requested torque calculator 63 calculates a requested torque (requested driving torque) based on a requested acceleration requested in the autonomous driving control.

(Power Loss Calculator)

The power loss calculator 65 calculates a power loss of the motor drive system 2. For example, the power loss calculator 65 calculates a power loss related to the driving of the drive motor 10 based on a power loss of the drive motor 10, a power loss of the first inverter 21*a*, a power loss of the second inverter 21*b*, a power loss of the current supply path from the first inverter 21*a* to the drive motor 10, and a power loss of the current supply path from the second inverter 21*b* to the drive motor 10. The power loss calculator 65 calculates a power loss (first power loss A) in the single-inverter control mode using the first inverter 21*a*, a power loss (first power loss B) in the single-inverter control mode using the second inverter 21*b*, and a power loss (second power loss) in the twin-inverter control mode using both the first inverter 21*a* and the second inverter 21*b*.

(Control-Mode Setting Unit)

The control-mode setting unit 67 sets the control mode of the drive motor 10 to the single-inverter control mode or the twin-inverter control mode based on the requested torque calculated by the requested torque calculator 63 and the power loss calculated by the power loss calculator 65. Also, when setting the single-inverter control mode, the control-mode setting unit 67 sets the inverter to be used to the first inverter 21*a* or the second inverter 21*b*.

(Inverter Controller)

The inverter controller 69 controls the driving of one or both of the first inverter 21*a* and the second inverter 21*b* in accordance with the control mode set by the control-mode setting unit 67. When the single-inverter control mode using the first inverter 21*a* or the second inverter 21*b* is set, the inverter controller 69 controls the driving of the first inverter 21*a* or the second inverter 21*b* to supply a three-phase alternating current to the drive motor 10. In this case, the inverter controller 69 obtains a target current value with which a driving torque corresponding to the requested torque can be output, and supplies the current to the drive motor 10 via either the first inverter 21*a* or the second inverter 21*b*.

Also, when the twin-inverter control mode is set, the inverter controller 69 obtains a target current value including a half of the requested torque as the requested torque of the first inverter 21*a* and a half of the requested torque as the requested torque of the second inverter 21*b*, and supplies the current to the drive motor 10 via the first inverter 21*a* and the second inverter 21*b*.

The basic configuration common to the embodiments of the present disclosure has been described above.

Hereinafter, exemplary control processing by the control device 50 will be described in detail for each embodiment.

2. EMBODIMENTS

2-1. First Embodiment

First, calculation processing by a control device 50 according to a first embodiment of the present disclosure will be described.

Figure 5:
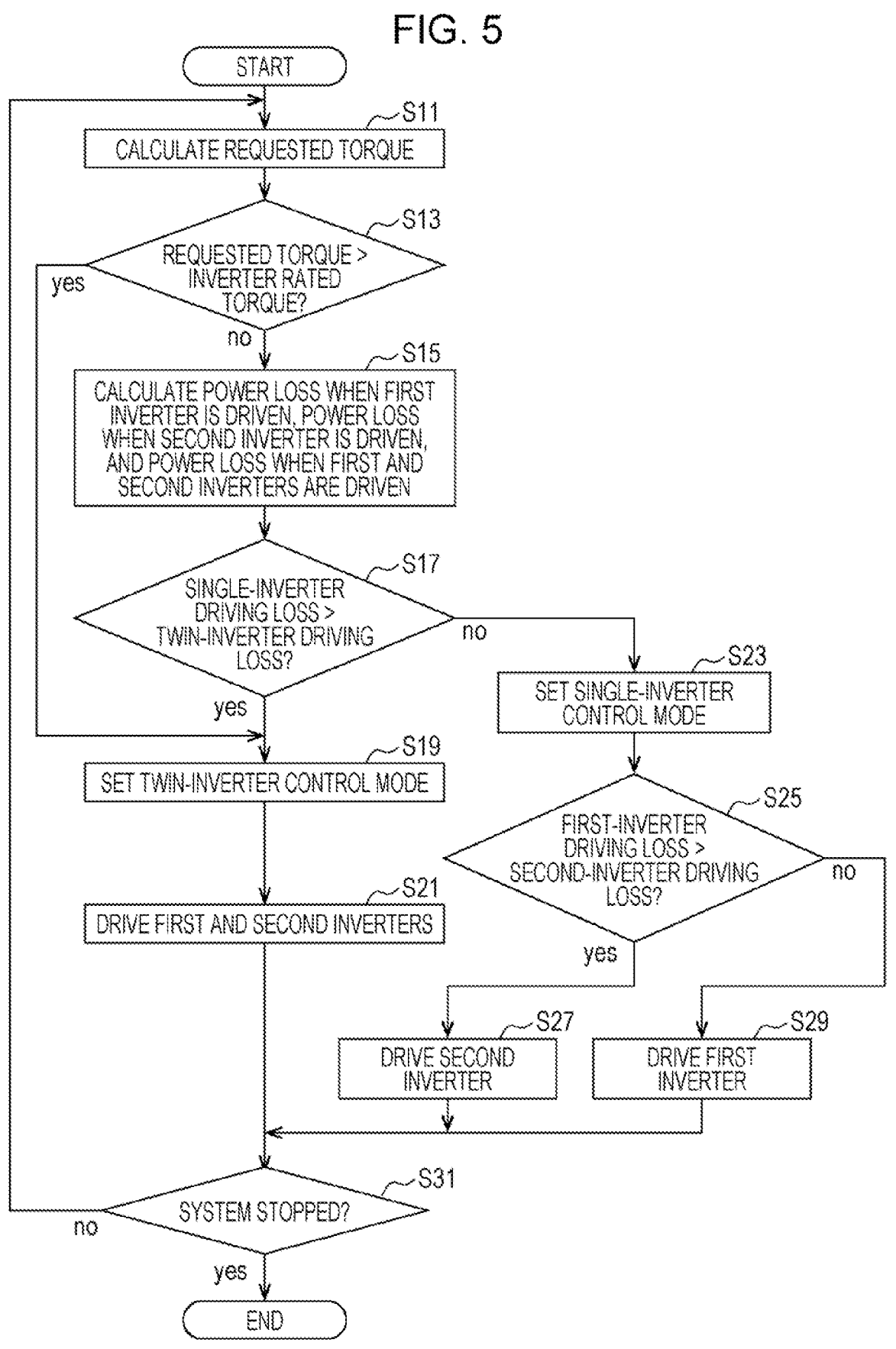
FIG. 5 is a flowchart illustrating an example of calculation processing performed by a motor control device according to a first embodiment of the present disclosure.

FIG. 5 is a flowchart illustrating an example of calculation processing by the control device 50 according to the present embodiment.

First, the requested torque calculator 63 of the processing unit 51 calculates a requested torque of the drive motor 10 (step S11). For example, the requested torque calculator 63 calculates a requested torque of the drive motor 10 based on information on a vehicle speed and a requested acceleration. The information on the vehicle speed can be acquired based on a sensor signal of the vehicle speed sensor. Also, the information on the requested acceleration can be acquired based on a sensor signal transmitted from the accelerator position sensor. The requested torque has a larger value as the vehicle speed is higher and as the requested acceleration is larger.

Next, the control-mode setting unit 67 of the processing unit 51 determines whether the calculated requested torque exceeds a rated torque that can be output from the drive motor 10 by power supply from each of the first inverter 21*a* and the second inverter 21*b* (step S13). The value of the rated torque per inverter is set in advance in accordance with the configuration of the inverter. Since the first inverter 21*a* and the second inverter 21*b* have the same configuration, the rated torque that can be output from the drive motor 10 by the power supply from the first inverter 21*a* has the same value as the rated torque that can be output from the drive motor 10 by the power supply from the second inverter 21*b*.

When the requested torque exceeds the value of the rated torque per inverter (S13/Yes), the control-mode setting unit 67 sets the control mode of the drive motor 10 to the twin-inverter control mode (step S19). When the requested torque exceeds the rated torque per inverter, the power supply from one inverter may provide an insufficient output for the driving torque corresponding to the requested torque from the drive motor 10. Thus, the power supply is shared by the first inverter 21*a* and the second inverter 21*b*.

When the twin-inverter control mode is set, the inverter controller 69 controls the driving of each of the first inverter 21*a* and the second inverter 21*b* to drive the drive motor 10 (step S21). For example, the inverter controller 69 sets a target current value of each of the first inverter 21*a* and the second inverter 21*b* by using a value obtained by multiplying the requested torque by one half as the requested torque of each of the first inverter 21*a* and the second inverter 21*b*. Based on the target current value and the rotational speed of the drive motor 10, the inverter controller 69 controls the driving of each of the first inverter 21*a* and the second inverter 21*b* to control the power supply to the drive motor 10.

In contrast, in a case where the requested torque is equal to or less than the value of the rated torque per inverter (S13/No), the power loss calculator 65 of the processing unit 51 calculates a power loss when the first inverter 21*a* is driven, a power loss when the second inverter 21*b* is driven, and a power loss when both the first inverter 21*a* and the second inverter 21*b* are driven (step S15). For each case, the power loss calculator 65 obtains a power loss of the drive motor 10, a power loss of the first inverter 21*a*, a power loss of the second inverter 21*b*, a power loss of the current supply path from the first inverter 21*a* to the drive motor 10, and a power loss of the current supply path from the second inverter 21*b* to the drive motor 10, and calculates the total value of the power losses.

For example, the power loss calculator 65 can obtain power efficiencies (power losses) of the first inverter 21*a* and the second inverter 21*b* with reference to a power efficiency map corresponding to the rotational speed of the drive motor 10, the requested torque, and the temperatures of the inverters. The power efficiency map is obtained in advance by experiments, simulations, or the like and stored in the storage 53. The power losses of the first inverter 21*a* and the second inverter 21*b* correspond to the power losses due to driving of the switching elements. The rotational speed of the drive motor 10 can be acquired based on a sensor signal output from the rotation sensor or a current waveform supplied from each inverter. The temperatures of the first inverter 21*a* and the second inverter 21*b* can be acquired based on sensor signals output from temperature sensors provided in their circuits.

Also, the power loss calculator 65 can obtain the power loss of the drive motor 10 with reference to a power efficiency map corresponding to the rotational speed and the requested torque of the drive motor 10. The power efficiency map is obtained in advance by experiments, simulations, or the like and stored in the storage 53. The power loss of the drive motor 10 corresponds to copper losses of the three-phase windings coupled to the first inverter 21*a* and the second inverter 21*b*. The power loss of the drive motor 10 may be corrected in accordance with the temperature of the drive motor 10. In this case, the power loss is corrected so as to be larger as the temperature of the drive motor 10 is higher. The temperature of the drive motor 10 can be acquired based on, for example, a sensor signal output from a temperature sensor provided at an appropriate position near the stator 11 of the drive motor 10.

Also, the power loss calculator 65 can obtain the power loss of the current supply path from the first inverter 21*a* to the drive motor 10 and the power loss of the current supply path from the second inverter 21*b* to the drive motor 10, for example, as follows. That is, when a reference temperature in the current supply path is t, a temperature coefficient of resistance is $\alpha t$, and a resistance at the reference temperature t is Rt, a resistance value R at a wiring temperature T can be expressed by the following equation (1).

$$R = Rt \times (1 + \alpha t (T - t)) \tag{1}$$

Thus, the power loss of the current supply path from each inverter to the drive motor 10 can be easily obtained from the above equation (1) by using the temperature of any portion of the current supply path as a representative value. Alternatively, the current supply path may be divided into predetermined portions in consideration of a temperature distribution provided by a thermal model of the electric wiring, and the sum of power losses of the portions may be set as the power loss of the entire current supply path.

The power losses calculated by the power loss calculator 65 are listed below.

$$EL1\text{-}A = Lm1 + Li1 + Lw1 \text{(a requested torque output by}$$
$$\text{driving of the first inverter } 21a)$$

$$EL1\text{-}B = Lm2 + Li2 + Lw2 \text{(a requested torque output by}$$
$$\text{driving of the second inverter } 21b)$$

$$EL2 = Lm1 + Li1 + Lw1 \text{(a requested torque output by}$$
$$\text{driving of the two inverters)}$$

EL1-A: a power loss (first power loss A) in the single-inverter control mode using the first inverter 21*a*

EL1-B: a power loss (first power loss B) in the single-inverter control mode using the second inverter 21*b*

EL2: a power loss (second power loss) in the twin-inverter control mode

Lm1: a power loss of the drive motor 10 (the three-phase winding coupled to the first inverter 21*a*)

Lm2: a power loss of the drive motor 10 (the three-phase winding coupled to the second inverter 21*b*)

Li1: a power loss of the first inverter 21*a*

Li2: a power loss of the second inverter 21*b*

Lw1: a power loss of the current supply path from the first inverter 21*a* to the drive motor 10

Lw2: a power loss of the current supply path from the second inverter 21*b* to the drive motor 10

Next, the control-mode setting unit 67 determines whether the calculated first power loss A EL1-A or second power loss B EL1-B in the single-inverter control mode is larger than the second power loss EL2 in the twin-inverter control mode (step S17). When the first power loss A EL1-A or the second power loss B EL1-B is larger than the second power loss EL2 (S17/Yes), the control-mode setting unit 67 sets the control mode of the drive motor 10 to the twin-inverter control mode (step S19). When the twin-inverter control mode is set, the inverter controller 69 controls the driving of each of the first inverter 21*a* and the second inverter 21*b* to drive the drive motor 10 (step S21).

When the first power loss A EL1-A or the second power loss B EL1-B is not larger than the second power loss EL2 (S17/No), the control-mode setting unit 67 sets the control mode of the drive motor 10 to the single-inverter control mode (step S23). Next, the control-mode setting unit 67 determines whether the first power loss A EL1-A in the single-inverter control mode using the first inverter 21*a* is larger than the second power loss B EL1-B in the single-inverter control mode using the second inverter 21*b* (step S25).

When the first power loss A EL1-A is larger than the second power loss B EL1-B (S25/Yes), the inverter controller 69 controls the driving of the second inverter 21*b* to drive the drive motor 10 (step S27). In contrast, when the first power loss A EL1-A is not larger than the second power loss B EL1-B (S25/No), the inverter controller 69 controls the driving of the first inverter 21*a* to drive the drive motor 10 (step S29).

In this way, the processing unit 51 sets the control mode and the inverter to be used in which the power loss of the motor drive system 2 decreases, drives the drive motor 10, and causes the drive motor 10 to output the requested torque. The processing unit 51 determines whether the motor drive system 2 has stopped (step S31), returns to step S11 as long as the system has not stopped, and repeatedly executes the processing of each step described above. In contrast, when the system has stopped (S31/Yes), the processing unit 51 ends the series of control processing.

Figure 6:
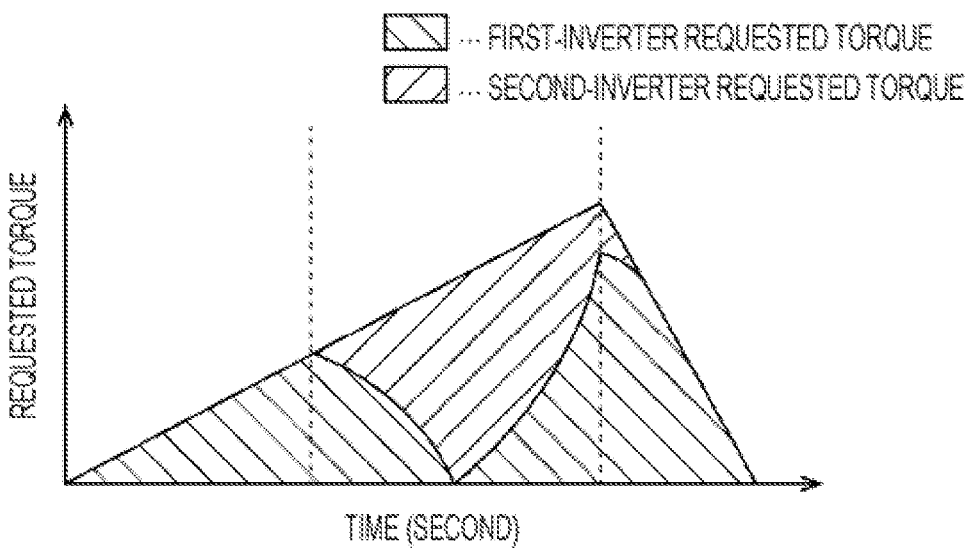
FIG. 6 is an explanatory diagram illustrating how to transfer an output torque at the time of switching inverters.

When the inverter to be used is switched, the inverter controller 69 may gradually change the ratio of the output torques over a predetermined time so that the sum of the output torque by the driving of the first inverter 21*a* and the output torque by the driving of the second inverter 21*b* meets the requested torque. For example, as illustrated in FIG. 6, when the inverter to be used in the single-inverter control mode is alternately switched between the first inverter 21*a* and the second inverter 21*b*, the output torque by the inverter that has been used is gradually decreased with respect to the requested torque, while the output torque by the inverter that is started to be used is gradually increased. That is, when the inverters are switched, the control mode is switched to the twin-inverter control mode once and then switched to the single-inverter control mode again, so that the output torque from the drive motor 10 is maintained. Accordingly, it is possible to suppress a rapid change in torque at the time of switching of the inverter to be used.

Also, while the drive motor 10 is driven in the single-inverter control mode, the control-mode setting unit 67 may switch the inverter to be used so that the temperature of the current supply path from the first inverter 21*a* to the drive motor 10 and the temperature of the current supply path from the second inverter 21*b* to the drive motor 10 are maintained to be lower than corresponding heat-resistance thresholds.

Figure 7:
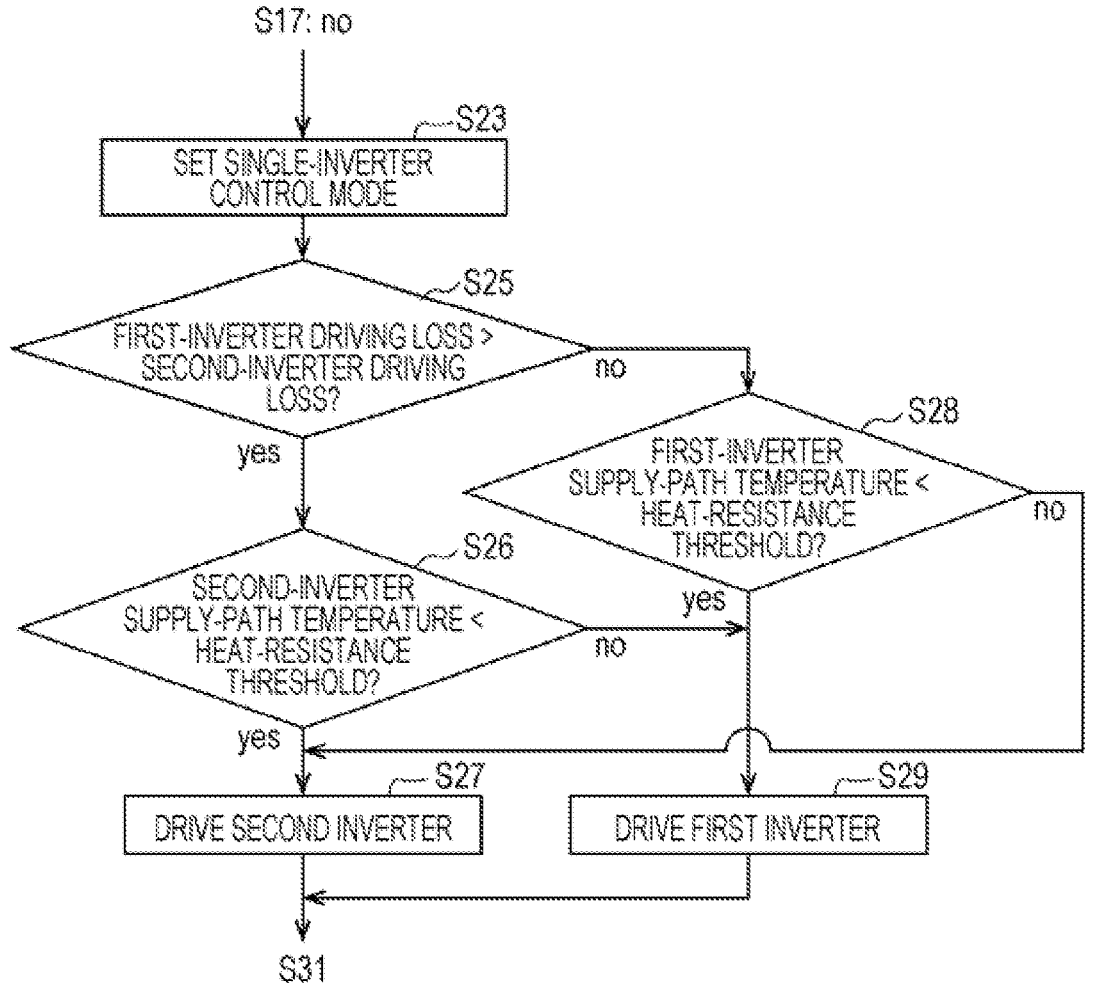
FIG. 7 is a flowchart illustrating processing of switching an inverter to be used in consideration of the temperature of a current supply path according to the same embodiment.

FIG. 7 is a flowchart illustrating processing of switching the inverter to be used in consideration of the temperature of the current supply path. The flowchart illustrated in FIG. 7 is replaced with step S23 to step S29 in the flowchart illustrated in FIG. 5. As described above, when determining in step S25 that the first power loss A EL1-A in the single-inverter control mode using the first inverter 21*a* is larger than the second power loss B EL1-B in the single-inverter control mode using the second inverter 21*b* (S25/ Yes), the control-mode setting unit 67 determines whether the temperature of the current supply path from the second inverter 21*b* to the drive motor 10 is lower than a heat-resistance threshold (step S26). When the temperature of the current supply path from the second inverter 21*b* to the drive motor 10 is lower than the heat-resistance threshold (S26/ Yes), the inverter controller 69 controls the driving of the second inverter 21*b* to drive the drive motor 10 (step S27). In contrast, when the temperature of the current supply path from the second inverter 21*b* to the drive motor 10 is equal to or higher than the heat-resistance threshold (S26/No), the inverter controller 69 controls the driving of the first inverter 21*a* to drive the drive motor 10 (step S29)

Similarly, when determining in step S25 that the first power loss A EL1-A is not larger than the second power loss B EL1-B (S25/No), the control-mode setting unit 67 determines whether the temperature of the current supply path from the first inverter 21*a* to the drive motor 10 is lower than the heat-resistance threshold (step S28). When the temperature of the current supply path from the first inverter 21*a* to the drive motor 10 is lower than the heat-resistance threshold (S28/Yes), the inverter controller 69 controls the driving of the first inverter 21*a* to drive the drive motor 10 (step S29). In contrast, when the temperature of the current supply path from the first inverter 21*a* to the drive motor 10 is equal to or higher than the heat-resistance threshold (S28/No), the inverter controller 69 controls the driving of the second inverter 21*b* to drive the drive motor 10 (step S27)

In this way, by switching the inverter to be used so that temperature of each current supply path is maintained to be lower than the corresponding heat-resistance threshold, it is possible to suppress overheating of the current supply path while the driving of the drive motor 10 is controlled in the single-inverter control mode. Also, it is possible to prevent the wiring resistance of the current supply path from excessively increasing and the power loss from excessively increasing.

As described above, although the requested torque is equal to or less than the rated torque of one inverter, the control device 50 according to the first embodiment of the present disclosure compares the power losses EL1-A, EL1-B, and EL2 when the single-inverter control mode using the first inverter 21*a*, the single-inverter control mode using the second inverter 21*b*, and the twin-inverter control mode are set, and selects the control mode and the inverter(s) having the smallest power loss. Thus, it is possible to control the driving of the drive motor 10 in the control mode in which the power efficiency of the motor drive system 2 further increases. Also, when the inverter to be used is switched so that the temperature of each current supply path is maintained to be lower than the corresponding heat-resistance threshold, it is possible to suppress overheating of the current supply path while the driving of the drive motor 10 is controlled in the single-inverter control mode.

2-2. Second Embodiment

Next, calculation processing by a control device 50 according to a second embodiment of the present disclosure will be described.

Figure 8:
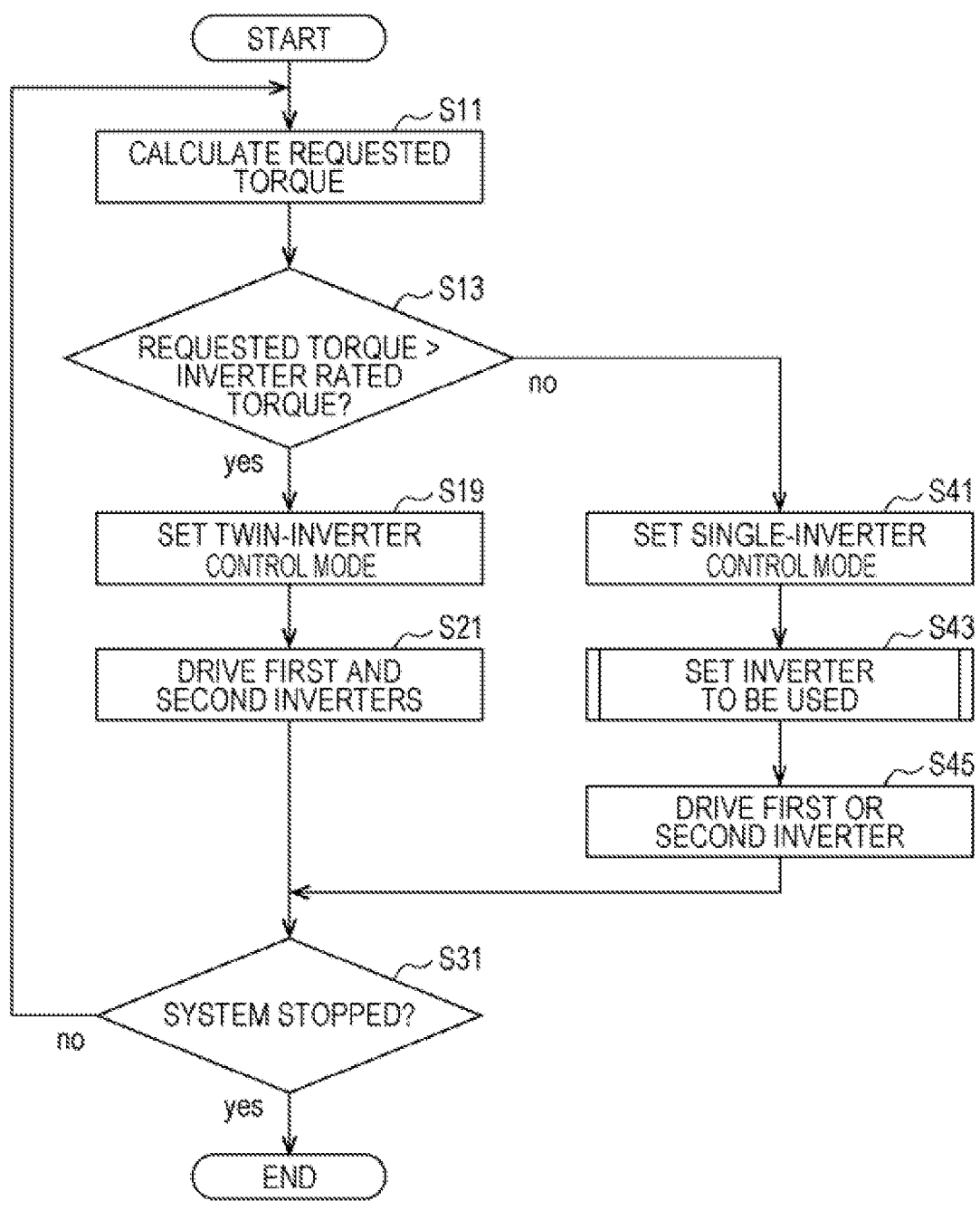
FIG. 8 is a flowchart illustrating an example of calculation processing performed by a motor control device according to a second embodiment of the present disclosure.

FIGS. 8 and 9 are flowcharts illustrating an example of calculation processing by the control device 50 according to the present embodiment.

First, the requested torque calculator 63 of the processing unit 51 calculates a requested torque of the drive motor 10 (step S11). Next, the control-mode setting unit 67 of the processing unit 51 determines whether the calculated requested torque exceeds a rated torque that can be output from the drive motor 10 by power supply from each of the first inverter 21*a* and the second inverter 21*b* (step S13). When the requested torque exceeds the value of the rated torque per inverter (S13/Yes), the control-mode setting unit 67 sets the control mode of the drive motor 10 to the twin-inverter control mode (step S19). When the twin-inverter control mode is set, the inverter controller 69 controls the driving of each of the first inverter 21*a* and the second inverter 21*b* to drive the drive motor 10 (step S21).

When the requested torque exceeds the value of the rated torque per inverter, the twin-inverter control mode is set, and the driving of the first inverter 21*a* and the second inverter 21*b* is controlled to drive the drive motor 10 in a manner similar to the first embodiment.

In contrast, when the requested torque is equal to or less than the value of the rated torque per inverter (S13/No), the control-mode setting unit 67 sets the control mode of the drive motor 10 to the single-inverter control mode (step S41). Next, the control-mode setting unit 67 executes processing of setting the inverter to be used (step S43).

FIG. 9 is a flowchart illustrating the processing of setting the inverter to be used.

The control-mode setting unit 67 acquires a wiring temperature of each of the current supply path from the first inverter 21*a* to the drive motor 10 and the current supply path from the second inverter 21*b* to the drive motor 10 (step S51). As the wiring temperature of each current supply path, the temperature of any portion of the current supply path may be used as a representative value. The current supply path may be divided into predetermined portions in consideration of a temperature distribution provided by a thermal model of the electric wiring, and the average value of the temperatures of the portions may be used as the wiring temperature.

Next, the control-mode setting unit 67 determines whether the drive motor 10 has been in the stop state or the twin-inverter control mode has been set until the last processing cycle (step S53). When the determination in step S53 is affirmative (S53/Yes), the control-mode setting unit 67 determines whether the wiring temperature of the current supply path from the first inverter 21a to the drive motor 10 is lower than the wiring temperature of the current supply path from the second inverter 21b to the drive motor 10 (step S55).

When the determination in step S55 is affirmative (S55/Yes), the inverter controller 69 controls the driving of the first inverter 21a to drive the drive motor 10 (step S57). In contrast, when the determination in step S55 is negative (S55/No), the inverter controller 69 controls the driving of the second inverter 21b to drive the drive motor 10 (step S59). That is, immediately after switching to the single-inverter control mode, an inverter having a low wiring temperature of the current supply path is selected to drive the drive motor 10. Accordingly, it is possible to suppress an increase in power loss due to a rise in wiring temperature of the current supply path.

In contrast, in a case where the determination in step S53 is negative (S53/No), that is, in a case where the single-inverter control mode is continued, the power loss calculator 65 calculates a power loss when the inverter in use is continuously used and a power loss when the inverter to be used is switched (step S61). Hereinafter, an example of a method of calculating the power loss when the inverter in use is continuously used and a method of calculating the power loss when the inverter to be used is switched will be described.

The power loss calculator 65 calculates a third power loss until a predetermined point in time when the inverter in use is continuously used, and a fourth power loss until a predetermined point in time when the inverter to be used is switched and used. The predetermined point in time may be set to any appropriate value in consideration of an operation time Ti for switching the inverter and a reference time Ta after switching of the inverter. For example, the predetermined point in time is set to a point in time after a time within a range of 10 milliseconds to several hundreds of milliseconds has elapsed in consideration of, for example, the responsiveness of the inverter, the stability of the output torque, and the frequency of switching of the inverter.

For example, it is assumed that the drive motor 10 is currently driven in the single-inverter control mode using the first inverter 21a. In this case, the power loss calculator 65 calculates a power loss (third power loss) EL3 until a predetermined point in time when the first inverter 21a is continuously used as follows. That is, the power loss calculator 65 obtains a power loss of the drive motor 10, a power loss of the first inverter 21a, and a power loss of the current supply path from the first inverter 21a to the drive motor 10 when the first inverter 21a is used until a predetermined point in time with reference to the current requested torque and rotational speed of the drive motor 10, and sets the sum of the power losses as the third power loss EL3. The third power loss EL3 corresponds to the total value of power losses when the first inverter 21a is used for a predetermined time (Ti+Ta).

Also, the power loss calculator 65 calculates a power loss (fourth power loss EL4) until a predetermined point in time when the first inverter 21a is switched to the second inverter

21b as follows. That is, the power loss calculator 65 expects a case where the use ratio of the first inverter 21a and the use ratio of the second inverter 21b are changed from 1:0 to 0:1 before the operation time Ti for switching the inverter elapses, and calculates the sum ELi of the power losses during this time. Also, the power loss calculator 65 assumes that the current requested torque and rotational speed of the drive motor 10 do not change, and calculates a power loss ELa in the reference time Ta after switching to the second inverter 21b. Then, the sum of the sum ELi of the power losses in the inverter switching operation time Ti and the power loss ELa in the reference time Ta after switching to the second inverter 21b is set as a fourth power loss EL4.

Next, the control-mode setting unit 67 determines whether the third power loss EL3 until the predetermined point in time when the inverter in use is continuously used is less than the fourth power loss EL4 until the predetermined point in time when the inverter to be used is switched and used (step S63). When the third power loss EL3 is less than the fourth power loss EL4 (S63/Yes), the inverter controller 69 controls the driving of the inverter while maintaining the inverter in use to drive the drive motor 10 (step S65). In contrast, when the third power loss EL3 is equal to or more than the fourth power loss EL4 (S63/No), the inverter controller 69 switches the inverter to be used and controls the driving of the inverter to drive the drive motor 10 (step S67).

Also in this embodiment, when the inverter to be used is switched, the inverter controller 69 gradually changes the ratio of the output torques over a predetermined time so that the sum of the output torque by the driving of the first inverter 21a and the output torque by the driving of the second inverter 21b meets the requested torque. That is, when the inverters are switched, the control mode is switched to the twin-inverter control mode once and then switched to the single-inverter control mode again, so that the output torque from the drive motor 10 is maintained. Accordingly, it is possible to suppress a rapid change in torque at the time of switching of the inverter to be used.

Figure 10:
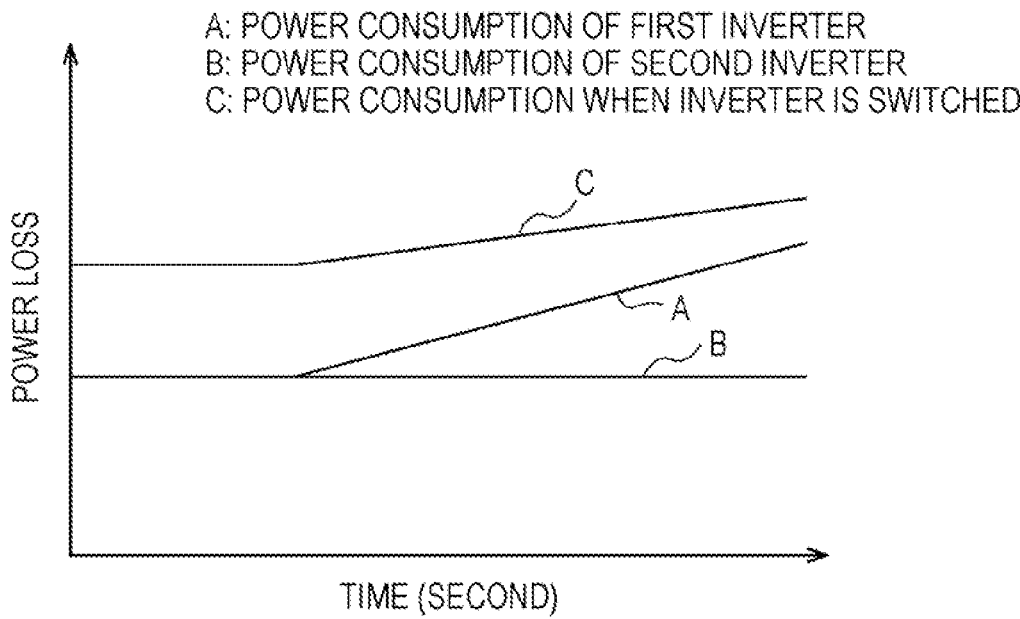
FIG. 10 is an explanatory diagram illustrating power consumptions of inverters.
Figure 11:
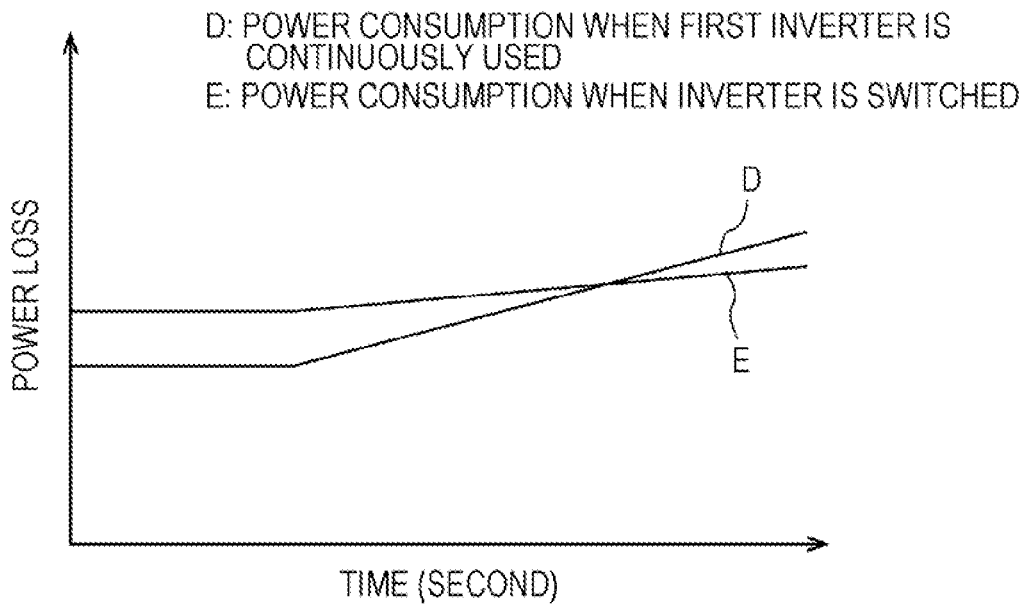
FIG. 11 is an explanatory diagram illustrating power consumptions when an inverter is continuously used and when inverters are switched.

FIGS. 10 and 11 are diagrams for explaining power losses when the inverter in use is continuously used and when the inverter to be used is switched and used.

FIG. 10 illustrates a power consumption (instantaneous loss) of the first inverter 21a when the first inverter 21a is used to drive the drive motor 10, a power consumption (instantaneous loss) of the second inverter 21b when the second inverter 21b is used to drive the drive motor 10, and a power consumption (instantaneous loss) at the time of switching the inverters. The power consumption at the time of switching can be obtained, for example, by adding a value obtained by dividing an estimated value of a loss in a torque fluctuation of each inverter and in cooperative control of each inverter by a switching time of the inverters, to the average value of the power consumption of the first inverter 21a and the power consumption of the second inverter 21b at the time of switching. FIG. 11 illustrates the power consumption during a time corresponding to the switching time of the inverters when the first inverter 21a is continuously used without switching the inverters, and the power consumption when the inverter to be used is switched to the second inverter 21b. The power consumption when the inverter to be used is switched to the second inverter 21b corresponds to the average value of the power consumptions during the time for switching the inverters of the power consumptions illustrated in FIG. 10.

In this example, the inverter to be used is switched from the first inverter 21a to the second inverter 21b at a time point at which a power consumption (D) when the first inverter 21a is continuously used without switching the inverters exceeds a power consumption (E) when the inverter to be used is switched to the second inverter 21b.

As described above, in the case where the requested torque is equal to or less than the rated torque of one inverter, the control device 50 according to the second embodiment of the present disclosure compares the power loss when the inverter in use is continuously used with the power loss when the inverter to be used is switched, and maintains or switches the inverter to be used so as to decrease the power loss. Thus, it is possible to control the driving of the drive motor 10 in the control mode in which the power efficiency of the motor drive system 2 further increases.

Although the embodiments of the present disclosure have been described in detail with reference to the accompanying drawings, the present disclosure is not limited to such examples. It will be apparent to those skilled in the art that various changes and modifications may be conceived without departing from the technical idea of the disclosure as defined by the appended claims. The changes and modifications obviously pertain to the technical scope of the present disclosure.

For example, although the double three-phase motor has been described as an example in the above embodiments, the drive motor may be a double-stator axial gap motor having two stators. Even though the drive motor is the axial gap motor, it is possible to set the single-inverter control mode using the inverter that supplies electric power to any one of the stators when the requested torque is low, and the technique of the present disclosure can be applied.

REFERENCE SIGNS LIST

1 . . . vehicle, 2 . . . motor drive system, 10 . . . drive motor, 13 . . . rotor, 16 . . . hydraulic brake system, 19 . . . brake hydraulic control device, 20 . . . inverter unit, 21a . . . first inverter, 21b . . . second inverter, 30 . . . converter unit, 31 . . . booster circuit, 40 . . . battery, 50 . . . control device

The invention claimed is:

1. A motor control device configured to control driving of a first inverter and a second inverter each configured to control a supply current to a three-phase alternating-current motor, the motor control device comprising:
one or more processors; and
one or more memories communicably coupled to the one or more processors,
wherein the one or more processors are configured to
switch a control mode between
a single-inverter control mode in which one of the first inverter and the second inverter is driven to control the supply current to the motor, and
a twin-inverter control mode in which both the first inverter and the second inverter are driven to control the supply current to the motor,
calculate each of a first power loss due to the single-inverter control mode and a second power loss due to the twin-inverter control mode, based on a power loss of the motor, a power loss of the first inverter, a power loss of the second inverter, a power loss of a current supply path from the first inverter to the motor, and a power loss of a current supply path from the second inverter to the motor,
set the control mode to the first power loss or the second power loss, whichever has a smaller power loss, and during the single-inverter control mode, acquire a temperature of the current supply path from the first inverter to the motor and a temperature of the current supply path from the second inverter to the motor, and switch an inverter to be used between the first inverter and the second inverter so that each of the temperature of the current supply path from the first inverter to the motor and the temperature of the current supply path from the second inverter to the motor is maintained to be lower than a heat-resistance threshold.

2. The motor control device according to claim 1, wherein the one or more processors are configured to, during the single-inverter control mode, compare a third power loss when an inverter in use is continuously used with a fourth power loss when an inverter to be used is switched and used, and when the third power loss is equal to or greater than the fourth power loss, switch the inverter to be used between the first inverter and the second inverter.

3. The motor control device according to claim 2, wherein the one or more processors are configured to, when the inverter to be used during the single-inverter control mode is switched, execute processing to maintain an output torque from the motor by switching the control mode to the twin-inverter control mode once and then switching the control mode to the single-inverter control mode again, calculate each of the third power loss until a predetermined point in time when the inverter in use is continuously used and the fourth power loss until a predetermined point in time when the inverter to be used is switched and used based on the power loss of the motor, the power loss of the first inverter, the power loss of the second inverter, the power loss of the current supply path from the first inverter to the motor, and the power loss of the current supply path from the second inverter to the motor, and when the third power loss is equal to or greater than the fourth power loss, switch the inverter to be used between the first inverter and the second inverter.

4. A vehicle comprising:
a motor drive system comprising a three-phase alternating-current motor, and a first inverter and a second inverter each configured to control a supply current to the motor,
a motor control device configured to
control the motor drive system,
switch a control mode between
a single-inverter control mode in which one of the first inverter and the second inverter is driven to control the supply current to the motor, and
a twin-inverter control mode in which both the first inverter and the second inverter are driven to control the supply current to the motor,
calculate each of a first power loss due to the single-inverter control mode and a second power loss due to the twin-inverter control mode based on a power loss of the motor, a power loss of the first inverter, a power loss of the second inverter, a power loss of a current supply path from the first inverter to the motor, and a power loss of a current supply path from the second inverter to the motor,
set the control mode to the first power loss or the second power loss, whichever has a smaller power loss, and during the single-inverter control mode, acquire a temperature of the current supply path from the first inverter to the motor and a temperature of the current supply path from the second inverter to the motor, and switch an inverter to be used between the first inverter and the second inverter so that each of the temperature of the current supply path from the first inverter to the motor and the temperature of the current supply path from the second inverter to the motor is maintained to be lower than a heat-resistance threshold.

5. A non-transitory recording medium storing a computer program that is to be applied to a motor drive system configured to control driving of a first inverter and a second inverter each configured to control a supply current to a three-phase alternating-current motor, wherein the motor drive system is configured to switch a control mode between a single-inverter control mode in which one of the first inverter and the second inverter is driven to control the supply current to the motor and a twin-inverter control mode in which both the first inverter and the second inverter are driven to control the supply current to the motor, and wherein the computer program causes one or more processors to execute calculating each of a first power loss due to the single-inverter control mode and a second power loss due to the twin-inverter control mode based on a power loss of the motor, a power loss of the first inverter, a power loss of the second inverter, a power loss of a current supply path from the first inverter to the motor, and a power loss of a current supply path from the second inverter to the motor, setting the control mode to the first power loss or the second power loss, whichever has a smaller power loss, and during the single-inverter control mode, acquiring a temperature of the current supply path from the first inverter to the motor and a temperature of the current supply path from the second inverter to the motor, and switching an inverter to be used between the first inverter and the second inverter so that each of the temperatures is maintained to be lower than a heat-resistance threshold.

\* \* \* \* \*